(12) United States Patent
Klemmer et al.

(10) Patent No.: US 6,708,026 B1
(45) Date of Patent: Mar. 16, 2004

(54) DIVISION BASED LOCAL OSCILLATOR FOR FREQUENCY SYNTHESIS

(75) Inventors: Nikolaus Klemmer, Apex, NC (US); Antonio J. Montalvo, Raleigh, NC (US); Steven L. White, Raleigh, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/481,248

(22) Filed: Jan. 11, 2000

(51) Int. Cl.[7] .............................. H04B 1/26; H04B 15/00
(52) U.S. Cl. ...................... 455/314; 455/131; 455/205; 455/260; 455/313; 331/16
(58) Field of Search ................................. 455/112, 113, 455/118, 131, 189.1, 205, 260, 207, 313, 314, 255, 257, 259; 331/DIG. 2, 17, 16; 375/376

(56) References Cited

U.S. PATENT DOCUMENTS

| | | | | |
|---|---|---|---|---|
| 5,020,147 A | * | 5/1991 | Okanobu | 455/189.1 |
| 5,038,117 A | * | 8/1991 | Miller | 455/260 |
| 5,448,191 A | | 9/1995 | Meyer | |
| 5,535,247 A | | 7/1996 | Gailus et al. | |
| 5,606,736 A | | 2/1997 | Hasler et al. | |
| 5,731,743 A | | 3/1998 | Sauer | |
| 5,896,428 A | * | 4/1999 | Yanagiuchi | 331/17 |
| 6,002,926 A | * | 12/1999 | Shiraishi | 455/314 |
| 6,005,904 A | * | 12/1999 | Knapp et al. | 331/DIG. 2 |
| 6,008,704 A | * | 12/1999 | Opsahl et al. | 455/112 |

FOREIGN PATENT DOCUMENTS

WO    WO 91/07824    11/1991

\* cited by examiner

*Primary Examiner*—Quochien Vuong
(74) *Attorney, Agent, or Firm*—Coats & Bennett, P.L.L.C.

(57) ABSTRACT

A programmable digital divider operates under the control of a division controller to derive a second synthesized frequency based on a first synthesized frequency. The programmable divider divides the first synthesized signal to derive the second synthesized signal. The division amount is an integer, but varies between integer values if necessary to achieve a non-integer average division value. The majority of the noise generated by the frequency synthesizer is generated away from the centerline frequency and is easily filtered by narrowband filter. The frequency synthesizer may optionally be incorporated into a modified phase-locked loop to generate the second synthesized signal. By using a digital divider, instead of a traditional phase-locked loop, these embodiments allow for integration of the frequency synthesizer onto an integrated circuit, thereby lowering cost and improving resistance to noise spurs. This approach is particularly suited to telecommunications applications.

30 Claims, 5 Drawing Sheets

DIVISION BASED LOCAL OSCILLATOR FOR FREQUENCY SYNTHESIS

BACKGROUND OF THE INVENTION

The present invention is directed to frequency synthesizers such as are commonly used in wireless communications mobile terminals and radio frequency receivers, and more particularly to a frequency synthesizer using a digital divider as a local oscillator.

Wireless communications devices, such as cellular telephones and other wireless communications mobile terminals, rely on frequency synthesizers for a wide variety of tasks. For instance, the frequency of the incoming signal is typically mixed with one or more synthesized frequencies to produce lower or "intermediate" frequency signals that may then be further processed by the internal electronics of the device. The synthesized frequencies used for this frequency conversion process must typically be generated within very tight frequency tolerances to properly mix the incoming signals down to the desired intermediate frequencies. Additionally, the synthesized frequencies should have little or no noise associated therewith to avoid corrupting or distorting the signal more than necessary.

Frequency synthesis in wireless communications devices is typically achieved by the use of one or more phase-locked loops. Such phase-locked loops typically include a resonator driven oscillator and comparing/locking circuitry to ensure that the synthesized frequency is at the desired operating frequency. The most common implementation of such a resonator is based on combinations of inductor and capacitor elements, printed transmission line elements on the printed circuit board, dielectric resonators, or Surface Acoustic Wave oscillators. While the quality factors of these resonators are high, and phase noise levels of oscillators built from them are low, the oscillators remain "off chip" components that cannot be integrated together on a single integrated circuit chip. Further, these oscillators may comprise up to fifteen elements which take both up space on the circuit board and add cost.

In recent years, an increased amount of effort has been spent on the integration of low phase noise oscillators into Application Specific Integrated Circuits (ASIC) in order to eliminate the resonator components off the circuit board and to save cost. One goal of such an effort is to develop frequency sources that are fully integrated and have the ability to meet the phase noise specifications levels for today's and tomorrow's wireless and telecommunications applications. However, the results of these development efforts to date have been less than fully satisfactory. As such, there remains a need for an improved method of low phase noise frequency generation that can be incorporated into an ASIC.

BRIEF SUMMARY OF THE INVENTION

The present invention utilizes a programmable digital divider to derive a second synthesized frequency based on a first synthesized frequency. For particular application in the receiver chain of wireless communications mobile terminal, the present invention takes advantage of the fact that the phase noise requirements of the frequency synthesizer for the second mixing stage are relaxed with respect to those of the frequency synthesizer for the first mixing stage. In preferred embodiments, the present invention generates a slightly more noisy synthesized signal, but the majority of the noise is generated away from the centerline frequency and is easily filtered by a commonly available narrowband filter.

In one embodiment, the present invention utilizes a programmable digital divider that operates under the control of a division controller. The programmable divider divides the first synthesized signal to derive the second synthesized signal. The division is by an integer amount, but varies between integer values if necessary to achieve a non-integer average division value. In other embodiments, the digital divider is incorporated into a modified phase-locked loop to generate the second synthesized signal. By using a digital divider, instead of a traditional phase-locked loop, these embodiments allow for fuller or complete integration onto an integrated circuit, thereby lowering cost and improving resistance to noise spurs. This approach is particularly suited to telecommunications applications.

DETAILED DESCRIPTION OF THE PREFERRED EMBODIMENT(S)

Figure 1:
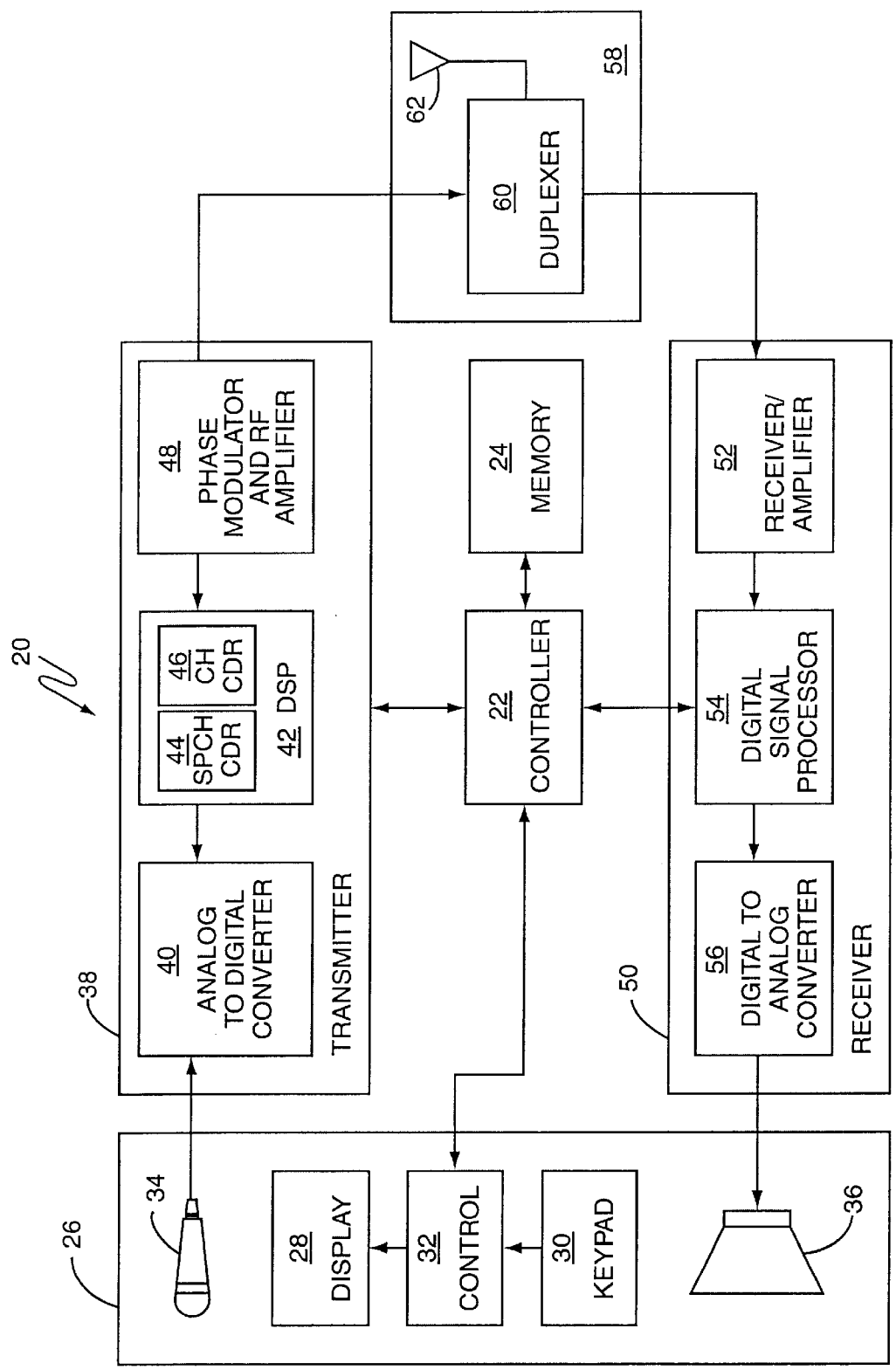
FIG. 1 is a schematic of a wireless communications mobile terminal.

The present invention provides a frequency synthesizer that utilizes an approach of dividing a first synthesized signal at a relatively higher frequency by an integer amount to generate a second synthesized signal at a relatively lower frequency. It is intended that, among other places, such a frequency synthesizer may be used in a dual conversion receiver chain of a wireless communications mobile terminal. As such, a brief discussion of a wireless communications mobile terminal may be helpful in understanding the present invention.

A mobile terminal 20 typically includes a controller 22, an operator interface 26, a transmitter 38, a receiver 50, and an antenna assembly 58. The operator interface 26 typically includes a display 28, keypad 30, control unit 32, microphone 34, and a speaker 36. The display 28 allows the operator to see dialed digits, call status, and other service information. The keypad 30 allows the operator to dial numbers, enter commands, and select options. The control unit 32 interfaces the display 28 and keypad 30 with the controller 22. The microphone 34 receives acoustic signals from the user and converts the acoustic signals to an analog electrical signal. The speaker 36 converts analog electrical signals from the receiver 50 to acoustic signals which can be heard by the user.

The analog electrical signal from the microphone 34 is supplied to the transmitter 38. The transmitter 38 includes an analog to digital converter 40, a digital signal processor 42, and a phase modulator and RF amplifier 48. The analog to digital converter 40 changes the analog electrical signal from the microphone 34 into a digital signal. The digital signal is passed to the digital signal processor (DSP) 42, which contains a speech coder 44 and channel coder 46. The speech coder 44 compresses the digital signal and the channel coder 46 inserts error detection, error correction and signaling information. The DSP 42 may include, or may work in conjunction with, a DTMF tone generator (not shown). The compressed and encoded signal from the digital signal processor 42 is passed to the phase modulator and RF amplifier 48, which are shown as a combined unit in FIG. 1. The modulator converts the signal to a form which is suitable for transmission on an RF carrier. The RF amplifier 48 then boosts the output of the modulator for transmission via the antenna assembly 58.

The receiver 50 includes a receiver/amplifier 52, digital signal processor 54, and a digital to analog converter 56. Signals received by the antenna assembly 58 are passed to the receiver/amplifier 52, which shifts the frequency spectrum, and boosts the low-level RF signal to a level appropriate for input to the digital signal processor 54.

The digital signal processor 54 typically includes an equalizer to compensate for phase and amplitude distortions in the channel corrupted signal, a demodulator for extracting bit sequences from the received signal, and a detector for determining transmitted bits based on the extracted sequences. A channel decoder detects and corrects channel errors in the received signal. The channel decoder also includes logic for separating control and signaling data from speech data. Control and signaling data is passed to the controller 22. Speech data is processed by a speech decoder and passed to the digital to analog converter 56. The digital signal processor 54, may include, or may work in conjunction with, a DTMF tone detector (not shown). The digital to analog converter 56 converts the speech data into an analog signal which is applied to the speaker 36 to generate acoustic signals which can be heard by the user.

The antenna assembly 58 is connected to the RF amplifier of the transmitter 38 and to the receiver/amplifier 52 of the receiver 50. The antenna assembly 58 typically includes a duplexer 60 and an antenna 62. The duplexer 60 permits full duplex communications over the antenna 62.

The controller 22 coordinates the operation of the transmitter 38 and the receiver 50, and may for instance take the form of a common microprocessor. This coordination includes power control, channel selection, timing, as well as a host of other functions known in the art. The controller 22 inserts signaling messages into the transmitted signals and extracts signaling messages from the received signals. The controller 22 responds to any base station commands contained in the signaling messages, and implements those commands. When the user enters commands via the keypad 30, the commands are transferred to the controller 22 for action. Memory 24 stores and supplies information at the direction of the controller 22 and preferably includes both volatile and non-volatile portions.

Figure 2:
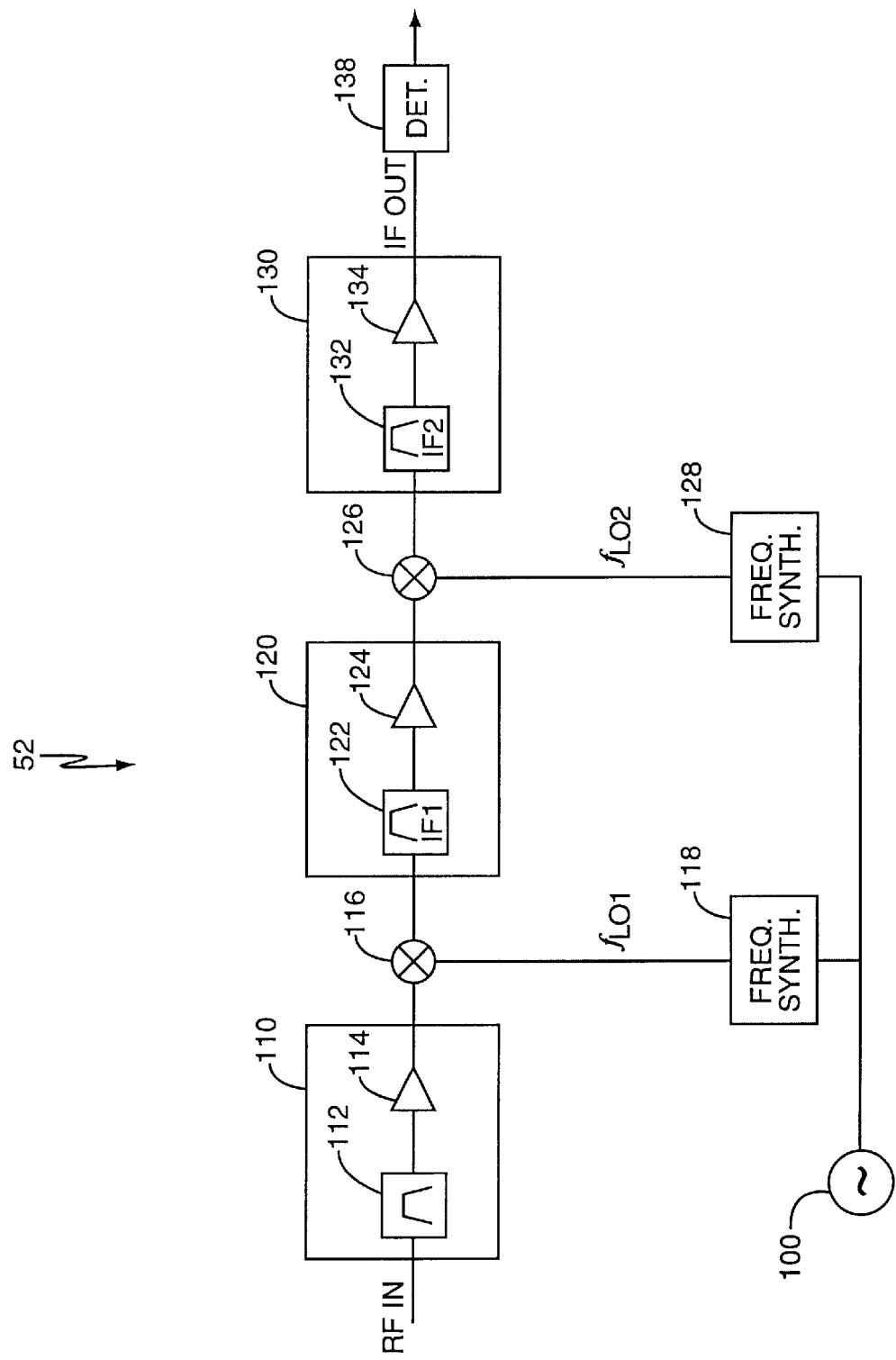
FIG. 2 is a schematic of one embodiment of a receiver chain as used in the mobile terminal of FIG. 1.

One embodiment of the receiver/amplifier 52 is shown in more detail in FIG. 2. Receiver/amplifier 52 includes a front end 110, a first mixer 116, a first intermediate frequency stage 120, a second mixer 126, a second intermediate frequency stage 130, and a detector 138. Signals received by the antenna 62 are applied to the input of front end 110. Front end 110 includes a preselector filter 112 and low-noise amplifier 114. The preselector filter 112 suppresses signals outside the primary band. The low-noise amplifier 114 increases the strength of the received signals passed by the filter 112. The mixer 116 converts the received signals to a first intermediate frequency. The injection signal ($f_{LO1}$) for mixer 116 is provided by a first frequency synthesizer 118 and is typically a low noise, high frequency signal. Typically, the output frequency of frequency synthesizer 118 is set by a controller, such as controller 22, to perform channel selection on the signals received at the antenna 62. Frequency synthesizer 118 may preferably be a phase-locked loop.

The output of mixer 116 is connected to the input of first intermediate frequency stage 120. First intermediate frequency stage 120 comprises a first intermediate frequency filter 122 followed by a first intermediate frequency amplifier 124. The purpose of the first intermediate frequency filter 122 is to reject the image frequency with respect to the second intermediate frequency and to provide some degree of adjacent channel suppression.

The output of the first intermediate frequency stage 120 is connected to the second mixer 126. The second mixer 126 converts the received signal to a second intermediate frequency. The injection signal ($f_{LO2}$) for the second mixer 126 is provided by a second frequency synthesizer 128. In the prior art, frequency synthesizer 128 is also a phase-locked loop, but separate from the phase-locked loop of frequency synthesizer 118. Typically, the output frequency of frequency synthesizer 128 is fixed and does not need to be changed when tuning to a different channel.

The output of the second mixer 126 is connected to the input of a second intermediate frequency stage 130 which comprises a second intermediate frequency filter 132 followed by a second intermediate frequency amplifier 134. The purpose of the second intermediate frequency filter 132 is to provide further adjacent channel suppression. The output of the second intermediate frequency stage 130 is connected to a detector 138 whose design is chosen according to the modulation scheme employed. For example, a receiver for FM signals would use a limiter followed by a discriminator as its detector, whereas a receiver for single sideband suppressed carrier signals would use a product detector or a synchronous detector.

Figure 3:
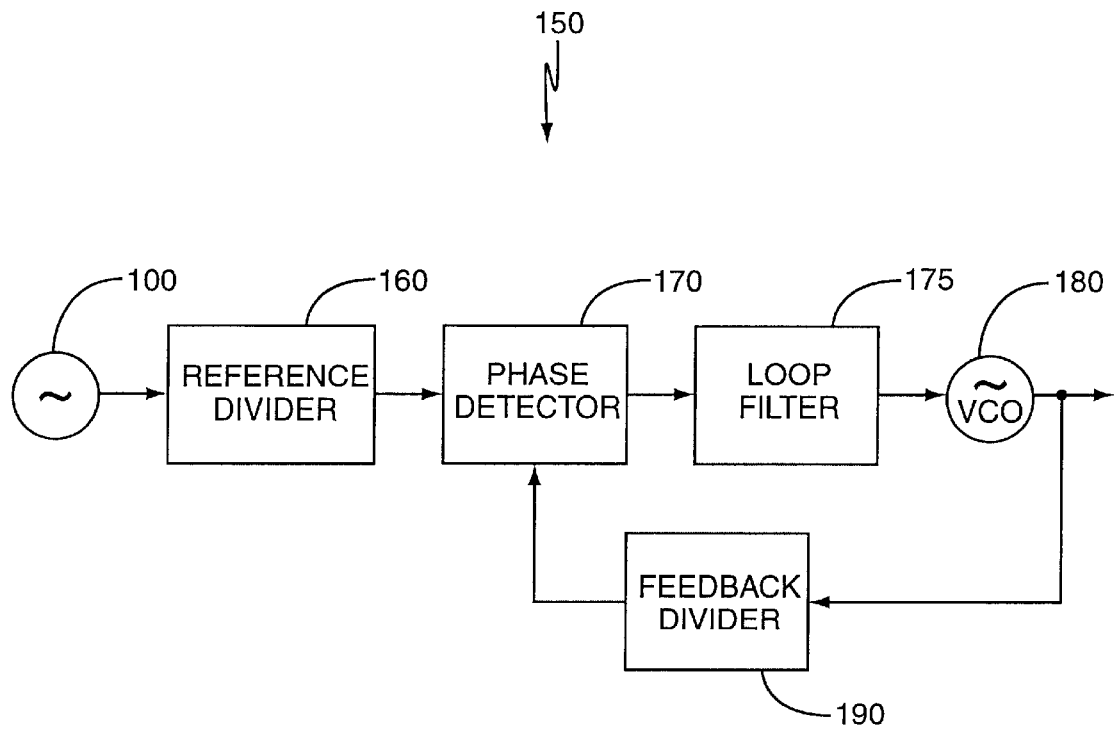
FIG. 3 is schematic drawing of a prior art phase-locked loop.

In the prior art, the frequency synthesizers 118 and 128 are made from conventional phase-locked loops (PLL) such as shown in FIG. 3 indicated generally by reference number 150. PLL 150 includes an oscillator 100, a reference divider 160, a phase detector 170, a filter 175, a low phase noise voltage controlled oscillator (VCO) 180, and a feedback divider 190. PLL 150 takes the known output of the reference oscillator 100 and sends it through the reference divider 160. Reference oscillator 100 generates a periodic signal at a fixed frequency that is known a priori within the mobile terminal 20 or other device in which the reference oscillator 100 is used. Further, the reference signal generated by the reference oscillator 100 is a periodic signal with rising and falling edges, for example a square wave. This divided reference signal is injected into the phase detector 170. Phase detector 170 is in turn connected to the filter 175 and the VCO 180. VCO 180 generates a periodic signal with rising and falling edges. This output signal from VCO 180 is the signal that is used in a mixer (such as mixer 116 or 126 in FIG. 2) or the like as required by the mobile terminal 20 incorporating the PLL 150. Additionally, the output from the VCO 180 is directed back to the phase detector 170 through the feedback divider 190. Phase detector 170 compares the inputs from the feedback divider 190 and the reference divider 160 and generates a correction signal, typically through a charge pump, to correct the output of the VCO 180 to match its phase to the phase of the input of the reference divider 160. That is, the phase detector 170 generates a signal which is filtered and then controls the VCO 180 so that VCO 180 outputs a signal that is at the correct frequency and phase. As noted, the VCO 180 in the conventional PLL 150 is an off-chip component including approximately fifteen elements.

Figure 4:
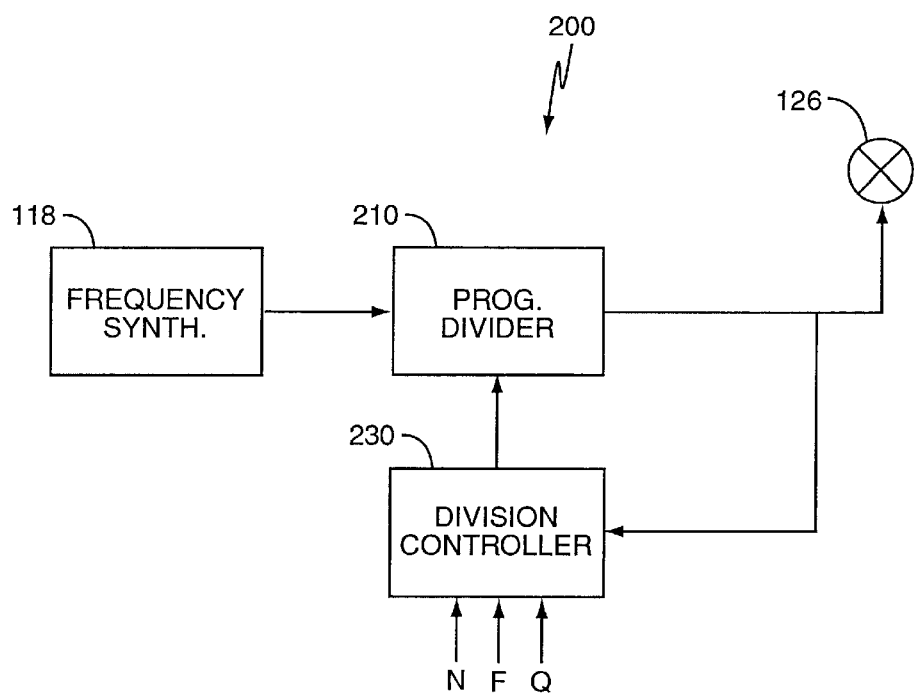
FIG. 4 is a schematic drawing of a first embodiment of the frequency synthesizer of the present invention.

In one embodiment, the present invention replaces second frequency synthesizer 128 with an improved frequency synthesizer 200 that uses the high frequency signal of frequency synthesizer 118 to derive the second mixing signal ($f_{LO2}$) directly. It should first be noted that for the present invention the details of the first frequency synthesizer 118 are unimportant. In fact, the first frequency synthesizer 118 may be any low noise frequency source generating a signal, sometimes referred to herein as the first synthesized signal, that has a relatively higher frequency than the desired output frequency of the second frequency synthesizer 200 (i.e., $f_{LO1} > f_{LO2}$). As such, the first frequency synthesizer 118 may be a PLL of the prior art or may optionally be of an improved type described in the United States patent application filed Dec. 8, 1999, entitled "Ring Oscillator With Jitter Reset." As shown in FIG. 4, the improved frequency synthesizer 200 includes a programmable divider 210 and a division controller 230. The output of the programmable divider 210 forms the output of the improved frequency synthesizer 200 that is typically fed to mixer 126 as the second synthesized signal. In addition, the output of programmable divider 210 is fed into division controller 230.

Programmable divider 210 may be implemented as a modulo M digital counter. Such a counter produces an output edge of a predetermined polarity every time a counter cycle has been completed (i.e., in a down counter, every time the counter state reaches zero). This event triggers the re-loading of the counter with a new starting value. For the approach of FIG. 4, the starting value of the programmable divider 210 is controlled by the output state of division controller 230. Since there are only integer division ratios available when using a digital counter as a frequency divider, the division ratio has to be dynamically changed such that the desired average division ratio equal can be achieved.

The division controller 230 dynamically controls the programmable divider 210, via altering the starting value of the programmable divider 210, by selecting a starting value from a predetermined set of possible starting values and establishing the starting value as its output state. Further, the output state of the division controller 230 is incremented by the signal fed back from the output of the programmable divider 210. The available states within the division controller 230 are determined by the inputs N,F,Q to the division controller 230. These inputs, N,F,Q, are determined as follows and may be supplied to the division controller 230 by a suitable source, such as the controller 22, that is aware of the two desired synthesized frequencies $f_{LO1}$ and $f_{LO2}$. It is intended that the sequence of output states of the division controller is such that the average division ratio becomes N+F/Q, where N, F, and Q are integer numbers.

Commonly, wireless transceivers are implemented such that all local oscillator frequencies are multiples of the channel spacing ($\Delta$) in the respective wireless communications system. Thus, the first synthesized frequency from frequency synthesizer 118 can be written as $f_{LO1} = n^*\Delta$. Similarly, the second synthesized frequency from frequency synthesizer 200 can be written $f_{LO2} = m^*\Delta$. Therefore, in order to generate the second synthesized frequency from the first synthesized frequency, the programmable divider 210 must average a division of n/m. Assuming n is larger than m, i.e., the first synthesized frequency is higher than the second synthesized frequency, then n/m=int(n/m)+((n mod m)/m). Thus, the programmable divider can achieve the desired division when N=int(n/m), F=n mod m, and Q=m. Just by way of example, if $\Delta$ is 30 kHz and $f_{LO2}$ is in the neighborhood of 150 MHz, then m should be on the order of 5000.

For the present invention, the value of n (ratio of $f_{LO1}$ to $\Delta$) is greater than the value of m (ratio of $f_{LO2}$ to $\Delta$). Stated another way, $f_{LO1}$ is greater than $f_{LO2}$. While the ratio n/m may be an integer, this is not required. Instead, the combination of the programmable divider 210 and the division controller 230 preferably act as a fractional divider so that the ratio n/m is fractional. Any one of a variety of approaches for fractional division may be used by the division controller 230 to control integer-based programmable divider 210. For instance, division controller 230 may be a multi-order delta-sigma modulator (such as third order), an accumulator or the like. Delta-sigma modulators are preferred because they shape the noise away from the desired frequency. Further, delta sigma modulators can be implemented with common digital circuits, such as registers and adders, in a fashion well known in the art. It should be noted that if adders are used, then there should be an increasing number of bits per adder. Also, in the case of a two-level quantitizer, the sign bit of the stage prior to the quantitizer can be used as the output of the modulator; if more than two quantization levels are used, a digital comparator circuit may be necessary.

Figure 5:
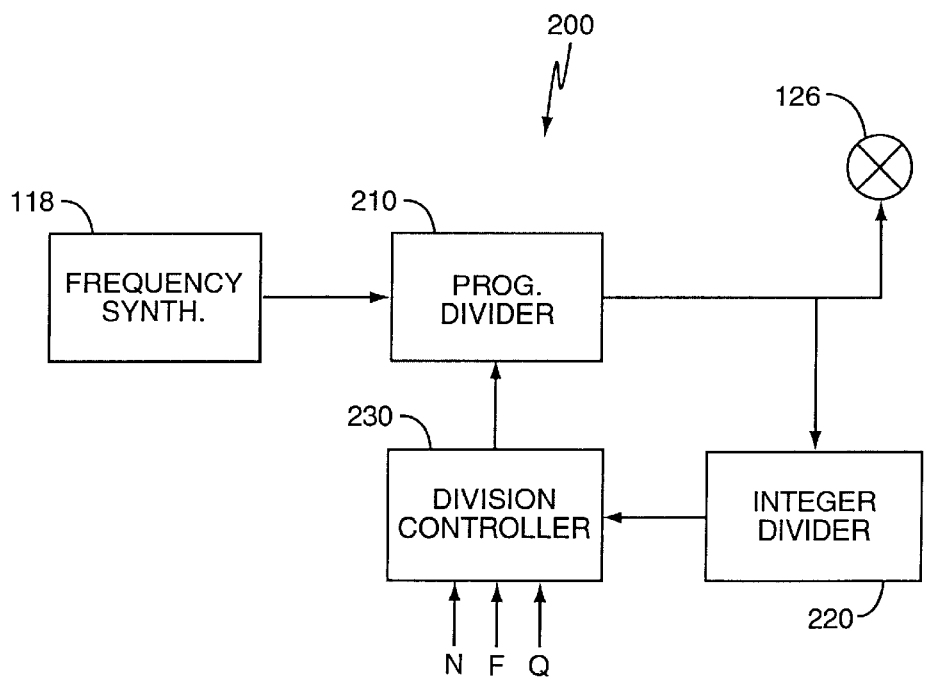
FIG. 5 is a schematic drawing of a second embodiment of the frequency synthesizer of the present invention.

It should be noted that in situations where the output of the programmable divider 210 is higher than the maximum frequency of the division controller 230, an alternate embodiment shown in FIG. 5 may be used. As compared with the embodiment of FIG. 4, the embodiment of the FIG. 5 includes a integer divider 220 inserted between the output of the programmable divider 210 and the input to the division controller 230. This arrangement reduces the effective clocking rate to the division controller 230 and also preserves quantization noise shaping properties of the division controller 230.

Figure 6:
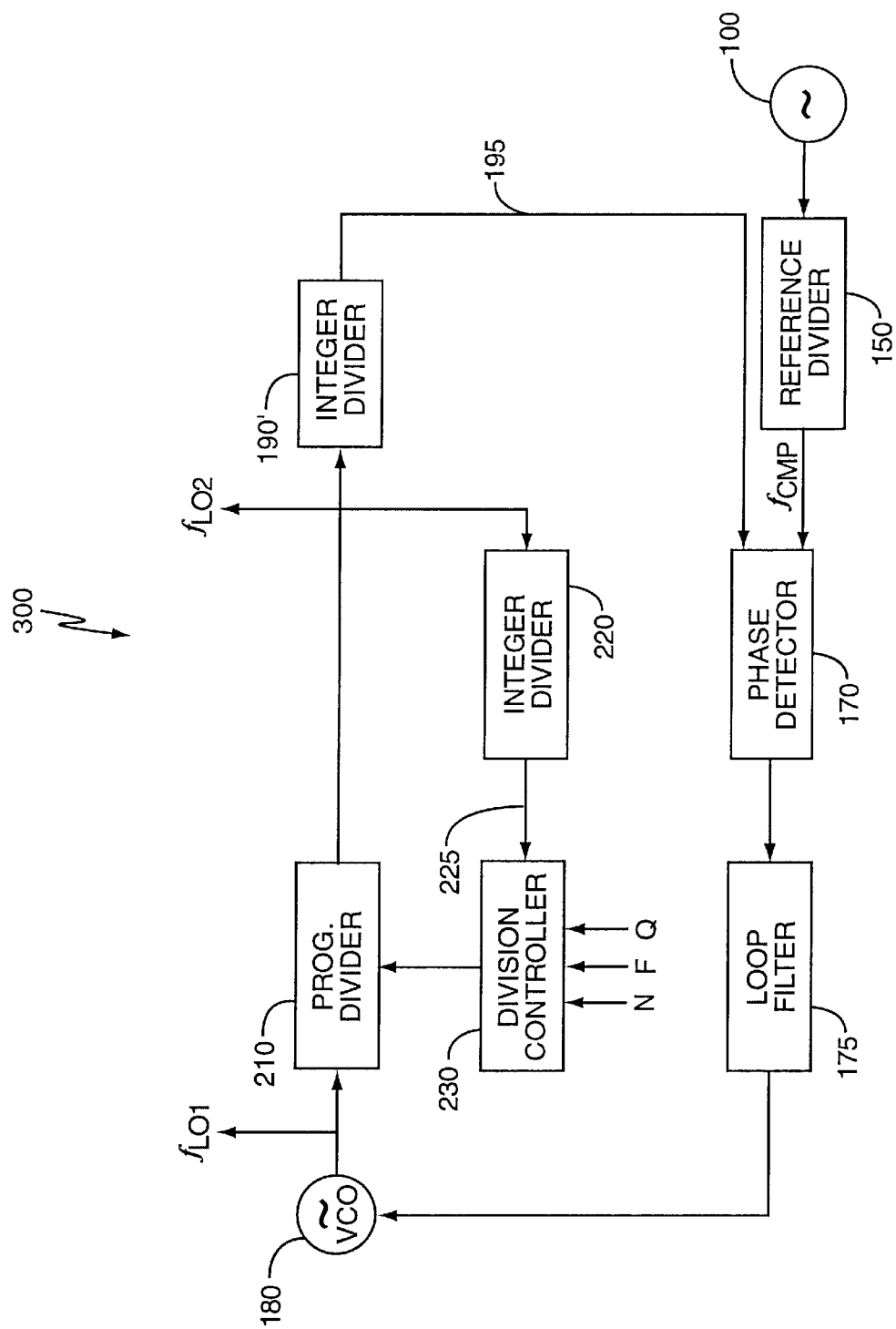
FIG. 6 is a schematic drawing of a third embodiment of the frequency synthesizer of the present invention incorporated into a phase-locked loop.

The alternate embodiment frequency synthesizer 300 of FIG. 6 is a modified PLL that synthesizes both synthesized frequencies ($f_{LO1}$, $f_{LO2}$). Reference oscillator 100 passes a reference signal through the reference divider 150 to form a compare signal $f_{CMP}$. Compare signal $f_{CMP}$ is injected into the phase detector 170 which compares compare signal to a feedback signal 195. Phase detector 170 generates a control signal that is filtered by loop filter and controls the VCO 180, which produces first output signal $f_{LO1}$. Output signal $f_{LO1}$ is split and fed to mixer 116 (FIG. 2) as well as programmable divider 210. Programmable divider 210 generates an output signal $f_{LO2}$ that is split and fed to mixer 126 (FIG. 2), a first integer divider 190', and a second integer divider 220. First integer divider 190' outputs the feedback signal 195 to the phase detector 170. While the preparation of feedback signal 195 by divider 190' may average a fractional division value, it is desirable to implement divider 190' as an integer divider to keep design complexity low. Second integer divider 220 creates the second feedback signal 225 that is fed into a division controller 230. Division controller 230 controls the programmable divider 210 as described above.

The VCO control voltage is filtered by the loop filter 175, such that the spectrum of the VCO output ($f_{LO1}$) corresponds to the output spectrum of a traditional PLL, such as frequency synthesizer 118. Hence the input signal to the programmable divider 210 has the same spectral properties as in the embodiment discussed above. Accordingly, the spectrum of the second synthesized output signal ($f_{LO2}$) has the same shape as previously described. It should be noted that the synthesized output signal $f_{LO1}$ has a relatively higher frequency while synthesized output signal $f_{LO2}$ has a relatively lower frequency, having been generated by a division of $f_{LO1}$ by the programmable divider 210. Further, the comparison frequency $f_{CMP}$ should be chosen as high as possible for the benefit of the phase noise properties of the first synthesized output signal $f_{LO1}$.

The approaches described above allow all components of the second frequency synthesizer, and in some embodiments all components other than the reference oscillator 100, to be integrated into an ASIC, As noted, this reduces the number of components required in the manufacturing process and reduces the size requirements of the circuit board placed in the device. In addition, integrating all the components on a single ASIC helps reduce noise and spur pick-up from magnetic coupling. This is particularly helpful as noted in mobile terminals, although it is conceivable that a portable radio or the like may wish to minimize the number and size of internal components. Furthermore, the implementation benefits from process feature scaling. As geometrical feature sizes of the transistors in the digital circuit shrink and/or the supply voltage of the circuit is being reduced, the power consumption of the frequency synthesizer will be reduced as well. Still further, the ability of the programmable divider to change the division rate allows a constant frequency output to be created so that the second IF filter 132 need not be tunable.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of operating a frequency synthesizer, comprising:
   a) receiving a first synthesized signal at a first frequency output from a phase-locked loop;
   b) integer dividing said first synthesized signal to generate a second synthesized signal at a second frequency based on said first synthesized signal at a programmable integer divider;
   c) controlling said integer divider via a division controller based on said second synthesized signal;
   d) outputting said second synthesized signal from said frequency synthesizer; and
   e) wherein the said first frequency is higher than said second frequency and wherein said first synthesized signal is independent of said second synthesized signal.

2. The method of claim 1 wherein said integer dividing said first synthesized signal to generate a second synthesized signal based on said first synthesized signal at a programmable integer divider is performed by a digital counter.

3. The method of claim 2 further including controlling said digital counter to achieve a non-integer average division ratio.

4. The method of claim 1 wherein said outputting said second synthesized signal from said frequency synthesizer includes outputting said second synthesized signal from said frequency synthesizer directly to a mixer.

5. The method of claim 1 wherein said integer dividing said first synthesized signal to generate a second synthesized signal based on said first synthesized signal at a programmable integer divider is performed by a digital counter and wherein said outputting said second synthesized signal from said frequency synthesizer includes outputting said second synthesized signal from said frequency synthesizer directly to a mixer, and further including controlling said digital counter to achieve a non-integer average division ratio.

6. The method of claim 1 wherein controlling said digital divider via said division controller based on said second synthesized signal comprises clocking said division controller based on said second synthesized signal.

7. A method of operating a phase-locked loop, comprising:
   a) receiving a reference signal;
   b) outputting a first synthesized signal from a controlled oscillator based on said reference signal;
   c) adjusting the phase of said first synthesized signal to match the phase of said reference signal;
   d) feeding said phase-matched first synthesized signal to a digital programmable divider and generating a second synthesized signal based on said first synthesized signal at said digital divider;
   e) controlling said digital divider via a division controller based on said second synthesized signal; and
   f) outputting said second synthesized signal from said phase-locked loop.

8. The method of claim 7 further including integer dividing said second synthesized signal and wherein said adjusting includes comparing said integer divided second synthesized signal with said reference signal.

9. The method of claim 7 wherein said controlling said digital divider via said division controller based on said second synthesized signal comprises clocking said division controller based on said second synthesized signal.

10. The method of claim 7 wherein said controlling said digital divider via a division controller based on said second synthesized signal includes said division controller providing an integer number sequence having an average value to said digital divider.

11. The method of claim 10 wherein said average value is a non-integer.

12. The method of claim 7 wherein said division controller is a delta-sigma modulator.

13. The method of claim 7 wherein the frequency of said first synthesized signal divided by the frequency of said second synthesized signal is a non-integer.

14. The method of claim 7 wherein said outputting a first synthesized signal, said outputting a second synthesized signal, said adjusting the phase of said first synthesized signal, and said generating a second synthesized signal based on said first synthesized signal all occur on a single computer chip.

15. A method of operating a receiver chain in a wireless communications device, comprising:
   a) receiving a signal from a remote location;
   b) converting said received signal to a first intermediate frequency to generate a first intermediate signal by mixing said received signal with a first synthesized signal, said first synthesized signal derived from a reference signal;
   c) integer dividing said first synthesized signal under the control of a division controller to derive a second synthesized signal, said division controller generating an output control signal based on said second synthesized signal; and
   d) converting said first intermediate signal to a second intermediate frequency to generate a second intermediate signal by mixing said first intermediate signal with said second synthesized signal.

16. The method of claim 15 further including filtering and amplifying said first intermediate signal prior to said converting to said second intermediate frequency.

17. The method of claim 15 further including filtering and amplifying said second intermediate signal after converting said first intermediate frequency to said second intermediate frequency.

18. The method of claim 15 wherein the frequency of said first synthesized signal divided by the frequency of said second synthesized signal is a non-integer.

19. The method of claim 15 wherein said integer dividing said first synthesized signal to derive a second synthesized signal is performed by a programmable digital counter.

20. The method of claim 15 further comprising clocking said division controller based on said second synthesized signal.

21. The method of claim 15 wherein said division controller is an accumulator.

22. The method of claim 15 wherein said converting said received signal to a first intermediate frequency to generate a first intermediate signal by mixing said received signal with a first synthesized signal is performed by a single phase-locked loop and wherein said converting said first intermediate signal to a second intermediate frequency to generate a second intermediate signal by mixing said first intermediate signal with said second synthesized signal is also performed by said phase-locked loop.

23. The method of claim 15 wherein a phase-locked loop generates said first synthesized signal but not said second synthesized signal.

24. The method of claim 15 wherein said first synthesized signal and said second synthesized signal are generated internal to a single computer chip and wherein said dividing to derive said second synthesized signal also occurs within said computer chip.

25. A method of operating a wireless communications mobile terminal, comprising:

a) receiving a signal from a remote location;

b) converting said received signal to a first intermediate frequency to generate a first intermediate signal by mixing said received signal with a first synthesized signal, said first synthesized signal derived from a reference signal;

c) integer dividing said first synthesized signal under the control of a division controller to derive a second synthesized signal, said division controller generating an output signal based on said second synthesized signal; and d) converting said first intermediate signal to a second intermediate frequency to generate a second intermediate signal by mixing said first intermediate signal with said second synthesized signal.

26. The method of claim 25 wherein the frequency of said first synthesized signal divided by the frequency of said second synthesized signal is a non-integer.

27. The method of claim 25 wherein said integer dividing said first synthesized signal to derive a second synthesized signal is performed by a programmable digital counter.

28. The method of claim 25 further comprising clocking said division controller based on said second synthesized signal.

29. The method of claim 25 wherein said division controller is a delta-sigma modulator.

30. The method of claim 25 wherein said first synthesized signal and said second synthesized signal are generated internal to a single computer chip and wherein said dividing to derive said second synthesized signal also occurs within said computer chip.

\* \* \* \* \*